United States Patent
Gao

(10) Patent No.: US 11,284,542 B1
(45) Date of Patent: Mar. 22, 2022

(54) MODULAR TWO-DIMENSIONAL COOLING SYSTEM DESIGN

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 17/029,268

(22) Filed: Sep. 23, 2020

(51) Int. Cl.
*H05K 7/20* (2006.01)

(52) U.S. Cl.
CPC ....... *H05K 7/2079* (2013.01); *H05K 7/20272* (2013.01)

(58) Field of Classification Search
CPC ............. H05K 7/20763–2079; H05K 7/20272
See application file for complete search history.

(56) References Cited

U.S. PATENT DOCUMENTS

| | | | |
|---|---|---|---|
| 7,106,590 B2* | 9/2006 | Chu ...................... | H05K 7/2079 165/104.33 |
| 8,031,468 B2* | 10/2011 | Bean, Jr. ............. | F28D 15/0266 361/696 |
| 8,395,896 B2* | 3/2013 | Belady ................. | H05K 7/2079 361/698 |
| 8,436,246 B1* | 5/2013 | Scofield ............. | H05K 7/20272 174/137 R |
| 8,583,290 B2* | 11/2013 | Campbell .......... | G05D 23/1934 700/282 |
| 9,414,525 B2* | 8/2016 | Campbell ............ | H05K 7/2039 |
| 9,560,794 B2* | 1/2017 | Sato .......................... | G06F 1/20 |
| 10,455,726 B2* | 10/2019 | Cader ................ | H05K 7/20254 |
| 2020/0106297 A1* | 4/2020 | Ross ..................... | H05K 7/2079 |

* cited by examiner

*Primary Examiner* — Zachary Pape
(74) *Attorney, Agent, or Firm* — Womble Bond Dickinson (US) LLP

(57) ABSTRACT

A two-dimensional liquid cooling system for data centers. A horizontal assembly is positioned above the IT cluster and serves as the main cooling unit. A vertical unit is positioned besides several IT clusters and is connected to several horizontal units and can be used as a backup or for enhanced cooling performance for any of the clusters. The horizontal assembly includes a cooling module that has a cooling unit, a coolant module that receives chilled liquid from the cooling unit and provides cooling liquid to a distribution layer which includes a supply loop and a return loop. The vertical unit is coupled to a plurality of supply and return loops so as to provide cooling liquid to several clusters. The cooling system and entire data center are modularized in different configurations.

20 Claims, 10 Drawing Sheets

MODULAR TWO-DIMENSIONAL COOLING SYSTEM DESIGN

FIELD OF THE INVENTION

Embodiments of the present invention relate generally to systems for data center cooling. More particularly, embodiments of the invention relate to liquid cooling system that is modular, resilient and efficient.

BACKGROUND

Cooling is a prominent factor in computer system and data center design. In addition to cooling of the data center facility, modern high performance processors and IT equipment require efficient heat removal and advance cooling system. Heat removal from processors can be improved by the use of liquid cooling. Current implementation of liquid cooling involves liquid cooling facilities that are designed and built specifically for a particular data center. Chilled water pipes then deliver chilled water from the facilities room into the server room and is connected to the various manifolds to distribute the liquid to the cooling loops. Such an approach has several drawbacks. First, each system must be redesigned specifically for each new data center. Second, the facilities are built to supply cooling to the entire data center. However, initially the data center may not be fully populated with servers, so much of the facilities are not fully utilized until the data center is completely populated. Third, once the facilities are built, it is very difficult and costly to modify and/or upgrade them. Finally, when a failure occurs, it may lead to the need to take some servers offline.

Therefore, a need exists for a liquid cooling solution that while providing high performance, would be efficient, resilient, and reliable. Additionally, the solution should be easy to deploy and maintained at reduced cost of acquisition and cost of ownership.

Modularity is an effective method for building and designing data centers, including the IT cluster, power and cooling systems therein. An effective modular design for liquid cooling system may significantly benefit the data center designers and developers. A modular cooling system may be designed to be generic and fit different data centers and IT clusters, such that a designer need only select the appropriate parts of the modular cooling system to fit to the particular data center. Such an approach also enables building and testing the system in the factory prior to shipment to the site, and enables fast assembly at the site in a plug and play fashion.

BRIEF DESCRIPTION OF THE DRAWINGS

Embodiments of the invention are illustrated by way of example and not limitation in the figures of the accompanying drawings in which like references indicate similar elements.

FIG. 2A is a schematic illustrating the overall structure of a liquid cooling system installed in a data center, while

DETAILED DESCRIPTION

Figure 1:
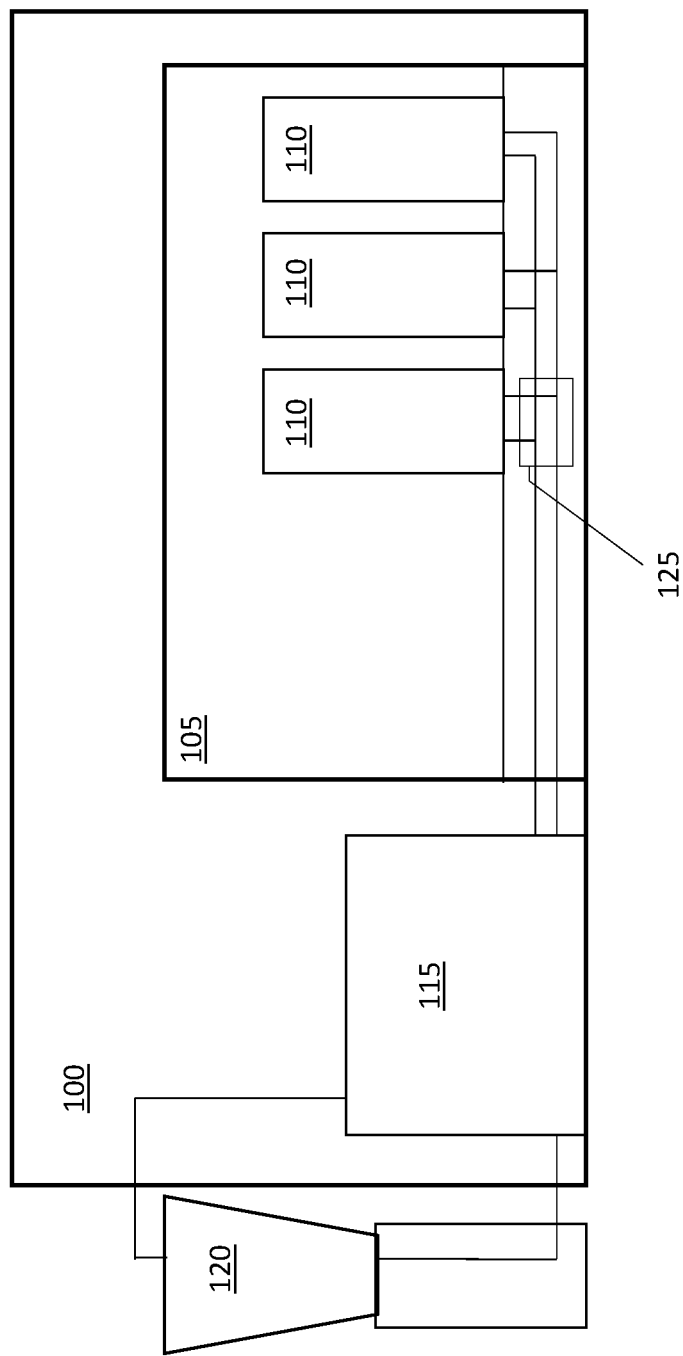
FIG. 1 is a schematic illustrating an example of a prior art data center with liquid cooling.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The current disclosure provides embodiments of modular liquid cooling systems for supporting IT cluster or IT container which is populated with liquid cooled IT equipment or liquid cooling units among the IT equipment. The design is modular in that it is assembled of discrete units, each of which may be assembled and tested prior to shipment to the site. Utilization is enhanced since the number of discrete cooling units may be the same as the number of IT clusters, and one backup unit can serve all of the clusters. Moreover, the system is easily expandable when additional clusters are put into service by the corresponding addition of discrete cooling units.

Redundancy design is critical to maintenance system uptime and reliability, in order to assure the service level agreement (SLA) of the corresponding business running on the servers. Disclosed embodiments provide innovative design for redundancy using minimum equipment to decrease the overall cost. In addition, the redundant unit provides additional features such as functioning as an enhanced cooling source in some scenarios.

When deploying liquid distribution for IT cluster, reliability is a critical requirement. The possibility of cooling liquid leaks is a critical challenge for many data center designers and developers. To obviate this possibility, disclosed embodiments provide a design wherein the main fluid distribution and fluid parts are fully separated from the IT equipment, while not impacting the performance and system operation.

As will be detailed more fully below, disclosed embodiments provide two-dimensional cooling systems. The system includes a horizontal assembly, which is located on the top of the IT cluster, and a vertical assembly, which is located on the side and adjacent to the IT cluster. Such a design provides both redundancy and flexibility in cooling arrangements. The entire system is built using modular concept, and includes one or more cooling modules, a coolant module and a distribution module. These modules can be assembled as one unit or separated as individual modules. The modules can be operated in different modes for different types of redundancy and cooling levels.

The distribution module is connected to both the horizontal cooling assembly and the vertical cooling assembly. The distribution module receives cooling fluid from the two cooling assemblies and distributes cooling fluid through an optional extension layer. The extension layer provides the functions needed for the connecting of the cooling loops with the IT rack and/or cooling units.

The system design enables flexible modular design and configurations and it can be effectively deployed for different scales of data center campuses.

FIG. 1 is a simplified schematic illustrating an example of a prior art data center with liquid cooling facilities. The building 100 houses a data room 105 having a plurality of IT clusters 110, each cluster having a plurality of server racks therein. Cooling liquid facilities 115 are positioned outside of the data room 105 and may include some equipment, e.g., cooling tower 120, that is positioned outside the building 100. Various pipes and manifolds 125 deliver chilled water to the clusters 110, and return warm water from the clusters 110 to the facilities 115.

Figure 2A:
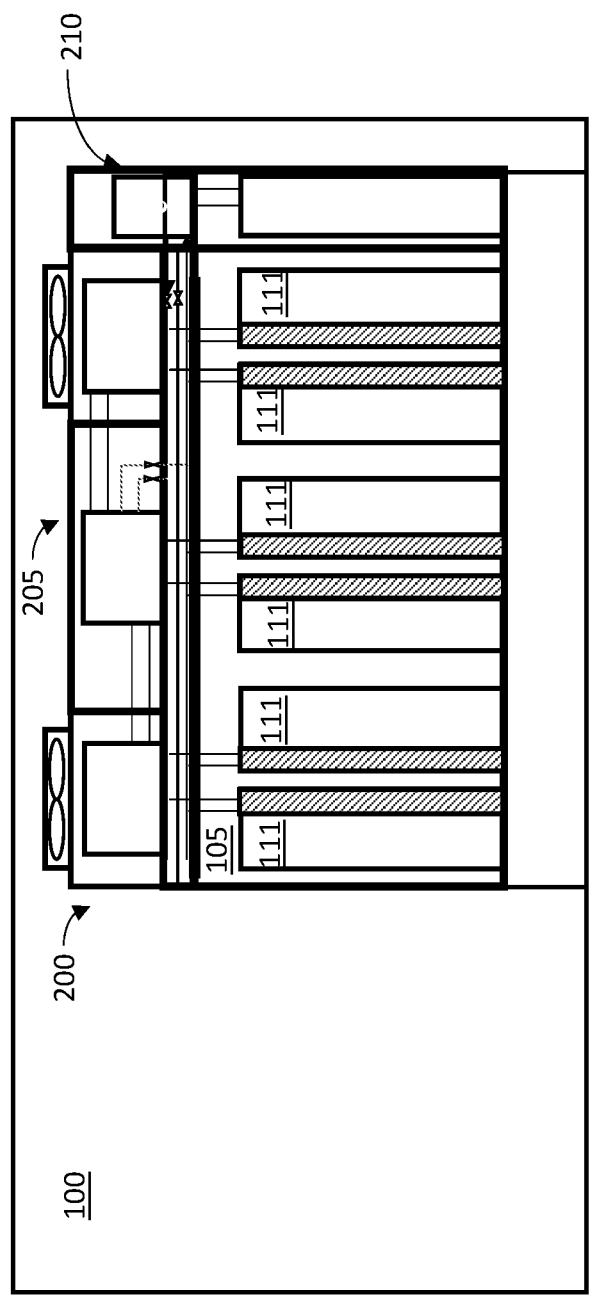

FIG. 2A is a schematic illustrating a side view the overall structure of a liquid cooling system according to an embodiment. As shown, the IT racks 111 are positioned in clusters within the server room 105, inside the data center 100. The liquid cooling system 200 includes a horizontal assembly 205 and a vertical assembly 210. As will be described in more details below, the horizontal assembly 205 provides the normal day-to-day chilling operation, while the vertical assembly 210 operates as a backup, an enhanced cooling operation, or substitute during, e.g., maintenance of the horizontal assembly. The horizontal assembly 205 serves one cluster, or one container of racks, while the vertical assembly 210 can serve several clusters or containers.

Figure 2B:
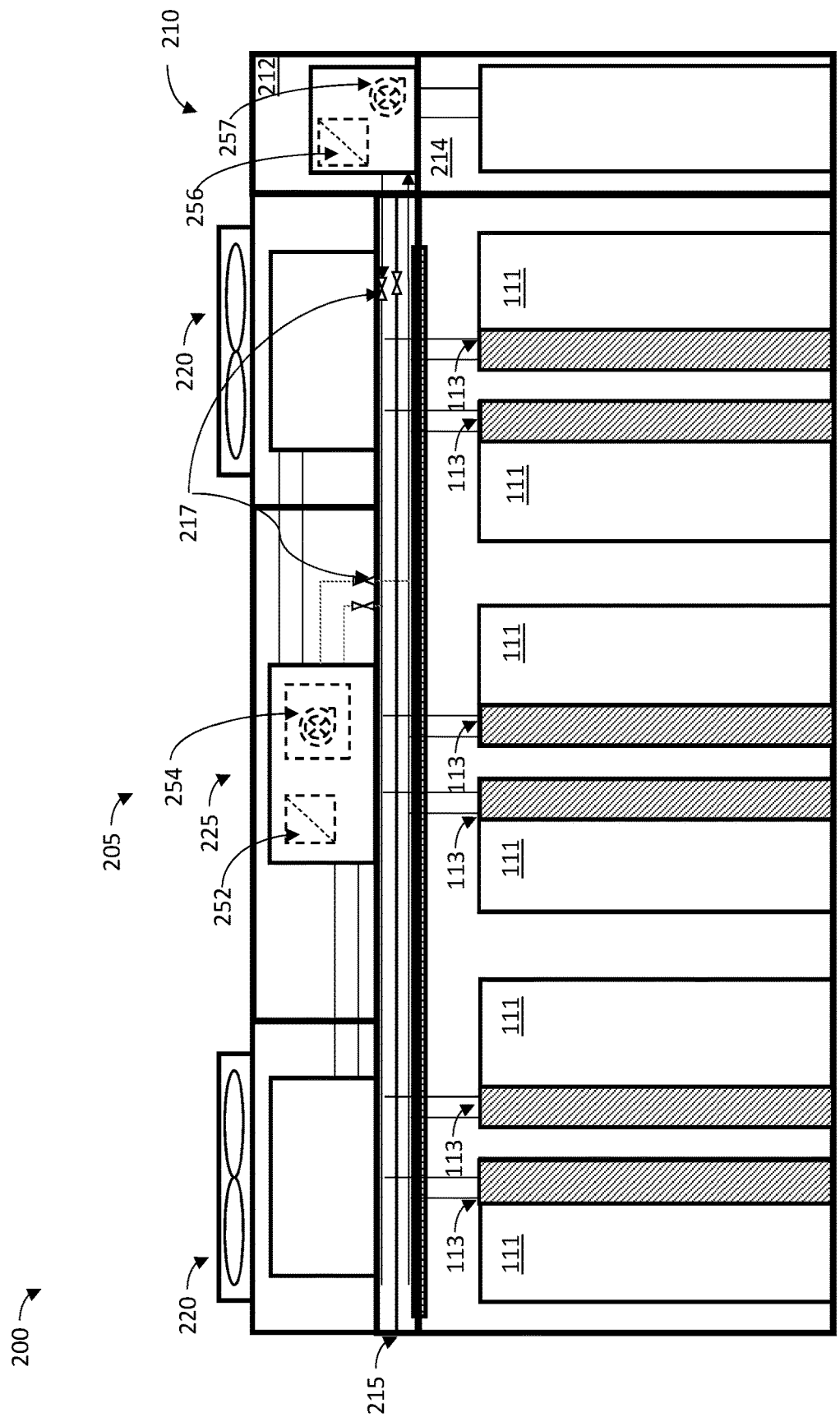
FIG. 2B is a mode detailed illustration of the system, according to an embodiment.

FIG. 2B illustrates the system shown in FIG. 2A in more details. As shown in FIG. 2B, in this particular example each of the server racks 111 includes an integrated heat exchanger 113, which requires cooled liquid as heat removal medium. The racks 111 can be integrated with heat exchanger 113 which are liquid to air cooling devices or other type of cooling devices such as rack mounted liquid distribution manifold. Other examples that may require cooled liquid include rear door cooler, in row cooler, or rack liquid distribution manifold. The cooled liquid can be provided by the horizontal assembly 205, by the vertical assembly 210, or both, depending on the operational mode of the distribution module 215. The operational mode of the distribution module 215 is set by the position of valves 217.

In this particular example the horizontal assembly 205 is made up of two cooling modules 220 and one coolant module 225. The coolant module 225 may be a chiller-less system which delivers cooling liquid to the distribution module 215 and receives return warm liquid from the distribution module 215. In one example the coolant module 225 includes an optional (indicated by dashed-lines) liquid-liquid heat exchanger 252, wherein liquid received from the cooling modules 220 is used as heat removal medium. In this manner, there are two liquid loops wherein the coolant module forms a separation between the liquid flowing in the cooling modules 220 and the liquid flowing in the distribution module 215 and hence the liquid flowing in the heat exchangers 113. This enables flowing different fluids in the loops of the cooling modules and the liquid flown in the heat exchangers 113. Consequently, for example, the liquid flown in the cooling modules 220 can be formulated for maximum heat conductance, while the liquid flown in the heat exchangers 113 may be formulated for maximum purity or more reliable and compatible with the wetted material used in the loop.

In another example the coolant module 225 includes an optional fluid filtration system 254, which consists of a pump, a liquid tank, filtration system and control system. In this configuration the coolant module receives the liquid from different cooling modules 220 and applies additional treatment to the liquid before delivering it to the distribution module 215. Consequently, in this arrangement there's one single liquid loop from the cooling modules 220 to distribution module 215.

In yet another embodiment, both liquid-liquid heat exchanger 252 and filtration system 254 may be packaged within the coolant module 225 and have different operating modes for different application purposes. Therefore, to distinguish between the cooling liquid flown in the cooling modules 220 and the liquid delivered by the coolant module 225 to the distribution module 215, the former may be referred to as the "first cooling liquid" while the later may be referred to as the "second cooling liquid" which may or may not be of the same composition. However, the use of the terms "first", "second", "primary" "secondary" etc., should not be construed to imply order, priority or hierarchy.

In disclosed embodiments, the coolant module 225 and the cooling modules 220 may be either separate modules that can be assembled together at the site, or a combined/integrated module that is delivered to the site as a single unit.

The vertical cooling assembly 210 forms an independent cooling system serving several clusters of IT racks 111. The vertical cooling assembly 210 includes a top module 212 having a liquid loop directly connecting to the distribution module 215. In one embodiment the top module 212 may be similar to the coolant module 225 having an optional heat exchanger 256, while in another embodiment may be simply a pumping system 257 for fluid supply to the distribution module 215. To distinguish the cooling liquid delivered by the vertical module 210 from that delivered by the horizontal module 205, it may be referred to as the "third cooling liquid". In this design, the third cooling liquid and the second cooling liquid which is delivered from the coolant module 225, are both delivered to the distribution module 215, and distributed to the racks by the distribution module 215, the composition of the second and third cooling liquid may be the same. However, the thermal conditions, such as temperature, may be different.

The bottom module 214 form a chiller, such as a chilled water system. The vertical cooling assembly 210 normally functions as a redundant or backup unit. Additionally, when needed, the vertical cooling assembly 210 can be used to provide enhanced cooling. In this sense, in this disclosure the second cooling liquid delivered by the coolant module 225 may be referred to as primary cooling liquid, while the third cooling liquid delivered by the vertical cooling assembly 210 may be referred to as secondary cooling liquid (the primary and secondary cooling liquids may have the same composition). Generally, one vertical cooling assembly 210 serves several horizontal cooling assemblies 205.

Figure 3:
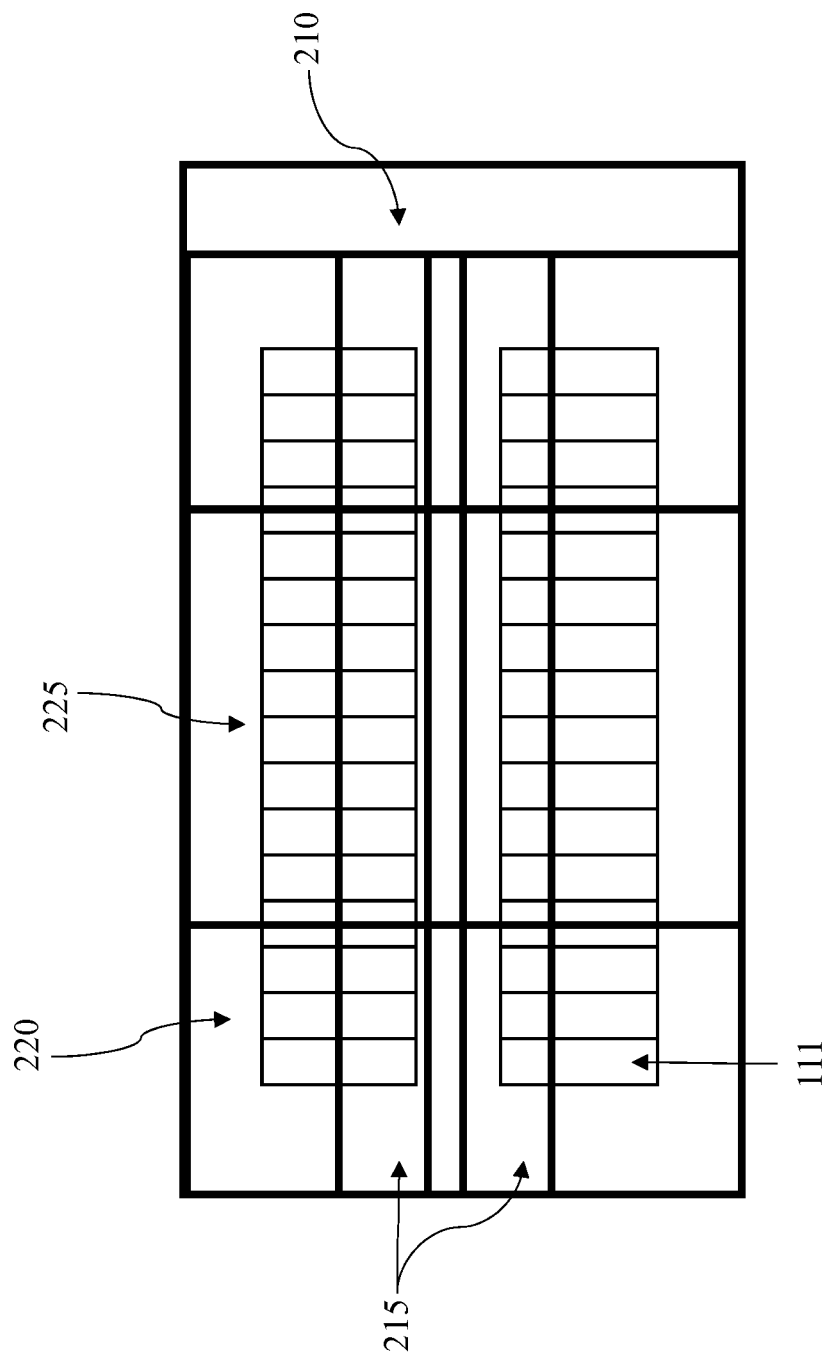
FIG. 3 is a schematic illustrating a top view of the main cooling module and the vertical cooling module according to an embodiment.

FIG. 3 illustrates a top view of the horizontal cooling assembly 205 and the vertical cooling assembly 210. In this Figure the coolant module 225 is in the middle between the two cooling modules 220. The distribution module 215 is underneath the cooling module 220 and coolant module 225.

These modules are interconnected through liquid loops, each loop predesigned and preassembled in each of the modules and are interconnected to other loops using a standard interface or connecting ports. The distribution module 215 may be customized with different sizes or different number of connecting ports to serve the particular cooling system integrated with the racks 111. In the example of FIG. 3 the cluster includes two rows of IT racks, wherein the cooling modules 220 and coolant module 225 serve the two rows. Conversely, the distribution module 215 distributes the liquid to the IT racks from the coolant module 225, the vertical assembly 210 or both. In other embodiments the modules can be arranged in other configurations. As illustrated in FIG. 3, each of the modules can be an independent unit connected to the other units via fluid conduits, such that other arrangement can be made to fit a particular deployment. Also, the number and size of units can be changed to fit any scale.

Figure 4:
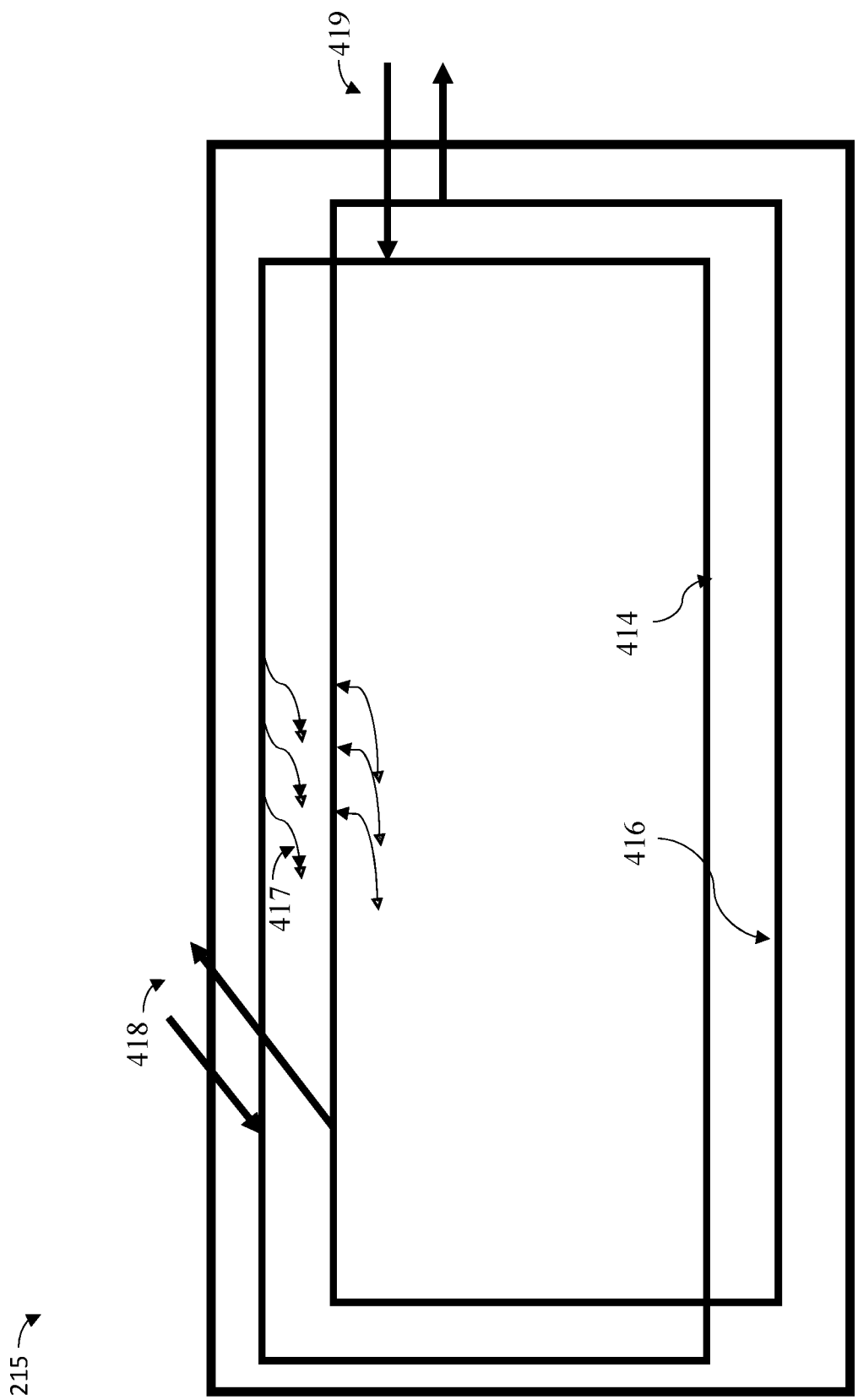
FIG. 4 is a simplified schematic illustrating the distribution module according to an embodiment.

FIG. 4 is a simplified schematic illustrating the distribution module 215 according to an embodiment. The distribution module 215 includes a supply loop 414 which receives cooling liquid from the coolant module 225 (i.e., the second or primary cooling liquid), and a return loop 416 which returns warm liquid to the coolant module 225. The supply and return loops are connected to the coolant module 225 via couplers 418 and to the racks via couplers 417. Additionally, the supply loop 414 and return loop 416 are coupled to the vertical cooling module 210 via couplers 419 (the direction of the arrows show the input and output lines) to receive the third or secondary cooling liquid.

Figure 5:
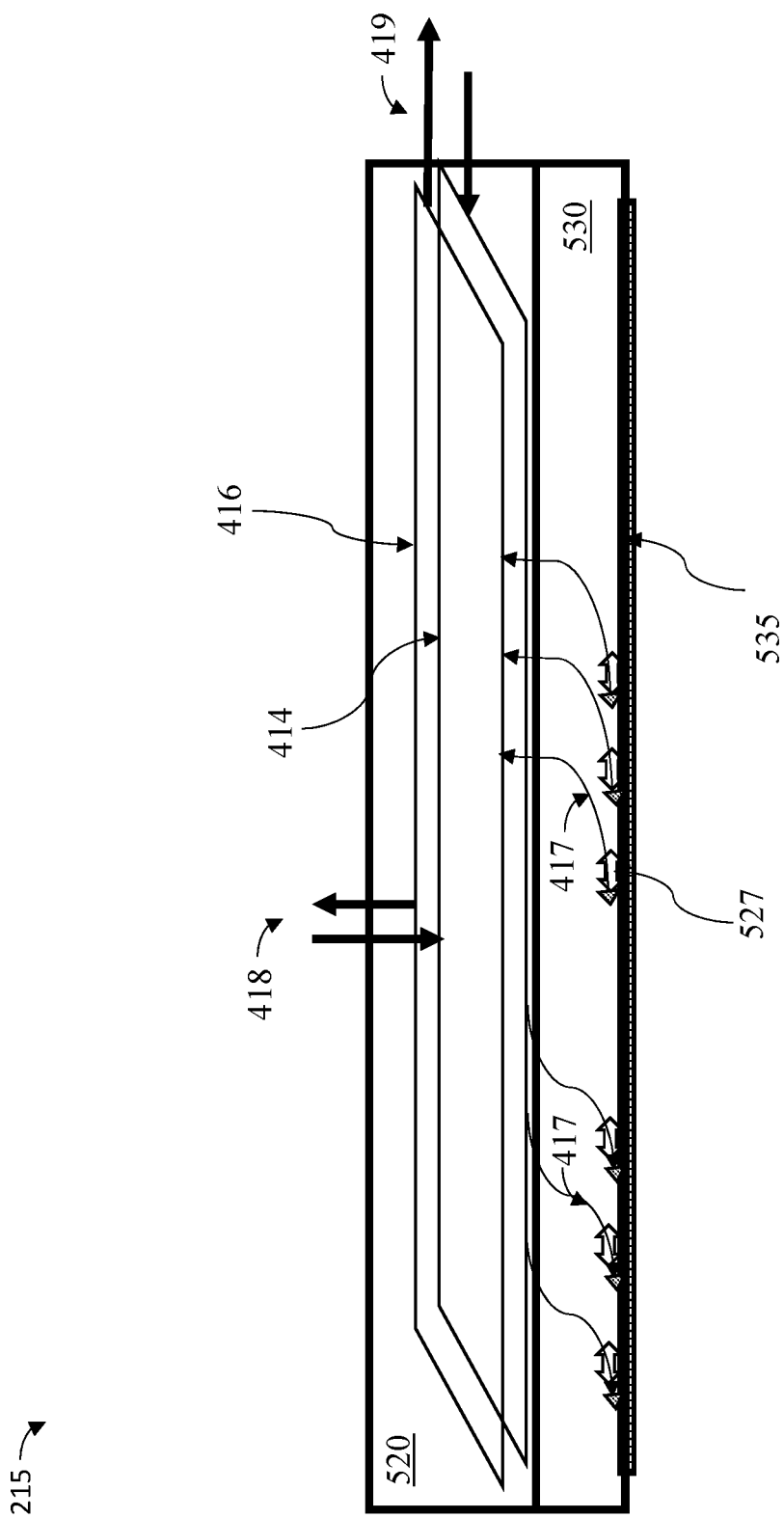
FIG. 5 is a simplified schematic illustrating another version of the distribution module according to another embodiment.

FIG. 5 is a simplified schematic illustrating another version of the distribution module according to another embodiment. In this embodiment the distribution module 215 is made up of a loop layer 520 and an extension layer 530. The loop layer 520 houses the supply loop 414 and return loop 416, while the extension layer houses the drop-connectors 417 that are used to connect the supply and return loops to the racks 111. The extension layer 530 includes port holders 527 that are used to secure the drop-connectors 417 when they are not connected to the racks 111. This feature may be used, e.g., during transport of the module to the assembling site or to secure drop-connectors that are not in use. Also, the port holders 527 may incorporate resilient assembly for applying a force to retract the flexible hoses of the drop-connectors 417 when they are disconnected from the racks 111. The extension layer 530 also includes channels 535 that are used to guide the drop-connectors 417 to the racks 111. Section 520 and section 530 can be either combined as one section in one embodiment or separated as two sections.

Figure 6:
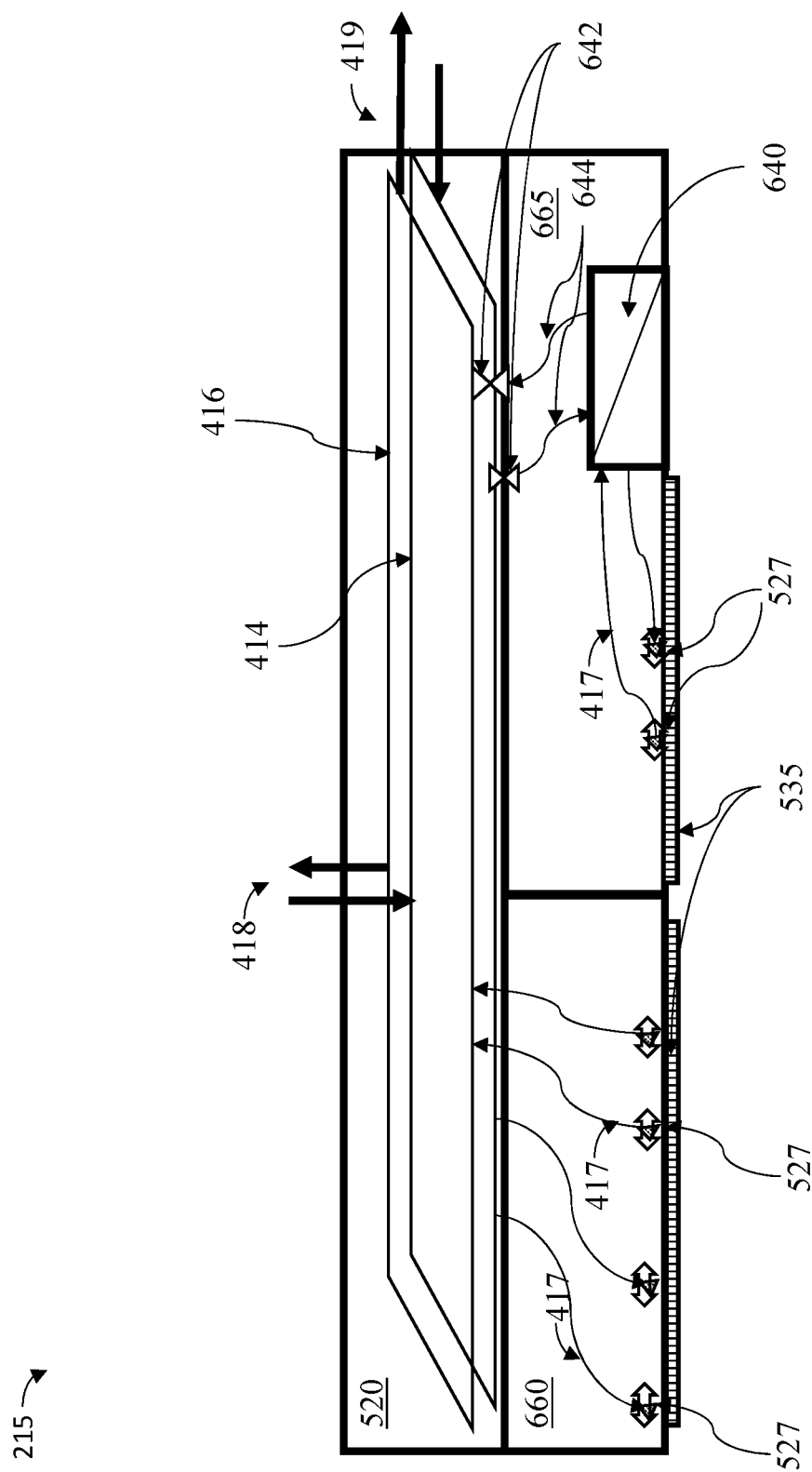
FIG. 6 is a schematic illustrating yet another version of the distribution module, according to an embodiment.

FIG. 6 illustrates yet another embodiment of the distribution module 215. In this embodiment, the loop layer 520 functions the same as the examples shown in FIG. 5. On the other hand, the extension layer 530 is divided into two compartments, a standard extension compartment 660 and an enhanced extension compartment 665. The standard extension compartment 660 is similar to that shown in FIG. 5, except that it is shorter than the entire length of the loop layer 520. The drop connectors 417 of the standard extension layer 660 are similar to those of FIG. 5 and are connected directly to the supply and return loops 414 and 416. In FIG. 6 the drop connectors 417 are shown attached to the port holders 527 for transport.

The enhanced extension compartment 665 also includes drop connectors 417, but they are not connected directly to the supply and return loops 414 and 416. Instead, the drop connectors 417 are connected to a liquid to liquid heat exchanger 640 that is mounted within the enhanced extension compartment 665. The liquid to liquid heat exchanger 640 has its cold side connected to the supply and return loops 414 and 416 through fluid connections 644 that are connected to fluid ports 642. In this respect, the fluid ports 642 are standard port that can be either used for connecting additional cooling equipment or to configure additional heat transfer loops. The cold side fluid connections can be preassembled for ease of installation. The hot side is assembled with flexible hoses and drop connectors 417 which are used to connect to the racks through opening channels 535. The drop connectors 417 of the enhanced extension compartment 665 are also shown attached to the port holders 527 for transport.

The enhanced extension compartment 665 can be added or removed from the system, or replaced with a standard extension compartment 660, depending on the actual use case. For example, if different racks require different working fluids, such as different purified fluid, or single phase and two-phase fluid, then the enhanced extension compartment 665 can be used to form a secondary loop for the racks. That is, the heat exchanger 640 receives the second cooling liquid and/or the third cooling liquid as a heat removal medium and provides a fourth cooling liquid to the racks. The fourth cooling liquid may have the same or different composition of the second cooling liquid.

By using the two extension compartments in tandem, the regular extension can still deliver the fluid running in the supply loop 414 to the rack, while the enhanced extension compartment delivers a different type of fluid to the racks and the fluid from the supply loop is still used as the cooling fluid in the heat exchanger 640. In this design, the operating conditions or the composition of the fluid in the standard extension compartment 660 and the enhanced extension compartment 665 can be configured differently and independently. Having the ability to install either standard or enhanced extension compartments, or both in tandem, imparts the system with additional flexibility and resiliency.

Figure 7:
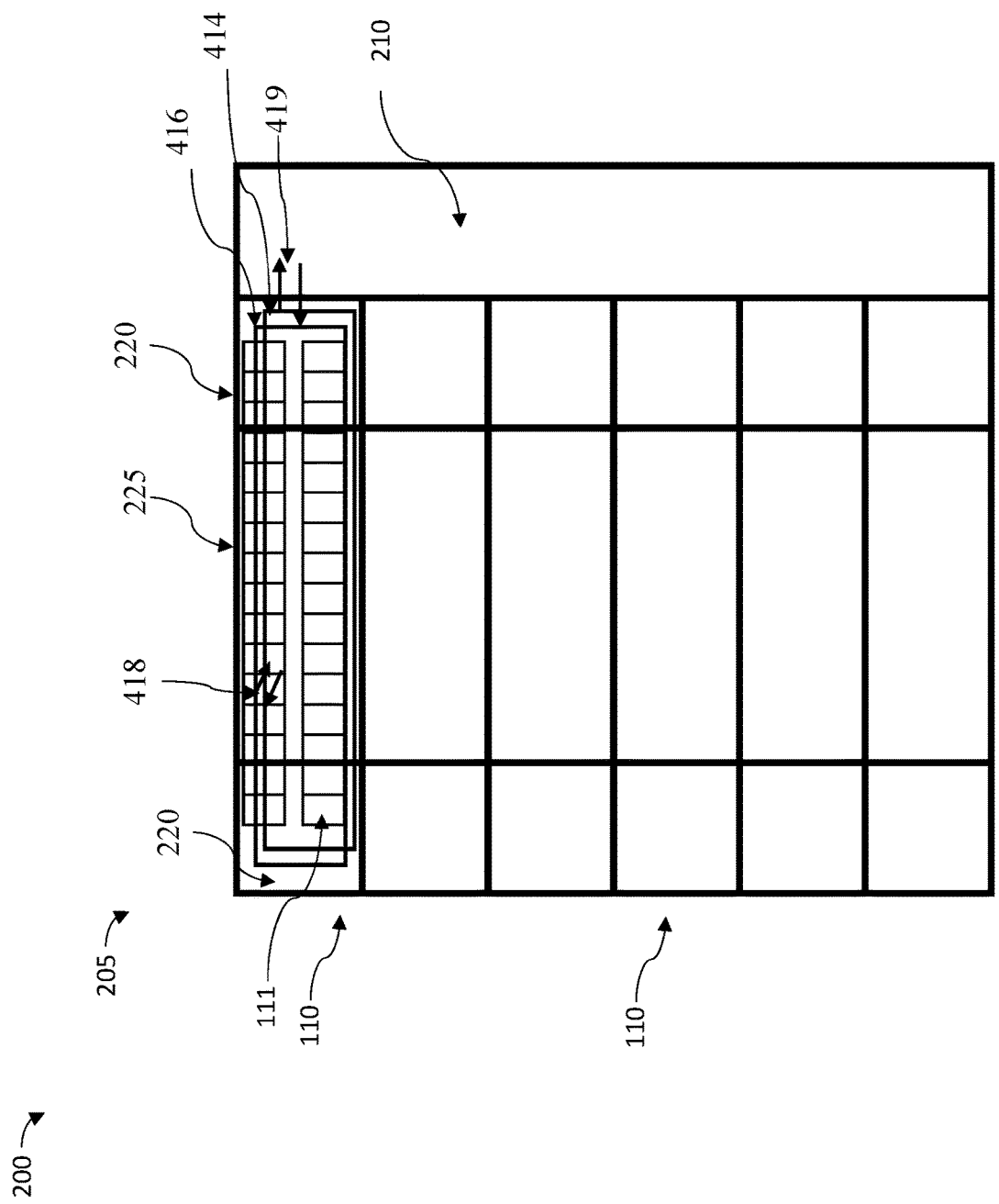
FIG. 7 is a schematic illustrating a top view of a cooling system in a data center, according to an embodiment.

FIG. 7 is a schematic illustrating a top view of a cooling system in a data center, according to an embodiment. The Figure illustrates six IT clusters 110, but illustrates the system 200 having one horizontal module 205 over only one cluster 110 for clarity. It should be appreciated that each of the clusters 110, when populated and requiring liquid cooling, may be provided with horizontal modules 205. When the cooling system 200 is provided over several or all of the IT clusters 110, each cluster 110 has one horizontal module 205 arranged on top of the cluster, and all of the clusters share one vertical cooing module 210. The supply and return loops 414 and 416 are connected to the respective coolant module 225 via connectors 418 and to the vertical module 210 via connectors 419. Thus, in the illustrated example, six sets of supply and return modules may be connected individually to six coolant modules of six different horizontal modules, and all of them connected to the one vertical module.

In the example of FIG. 7, each IT cluster 110 has two rows of server racks 111. Also, in this example the supply and return loops 414 and 416 of one horizontal module 205 serve the two rows of racks 111 in one cluster 110. In the case that one of the clusters 110 needs to be serviced, the valves 418 and 419 can be shut off, enabling the vertical module to continue to serve the remaining clusters. Similarly, if any of the cooling modules 220 or coolant modules 225 fails or needs to be serviced, valves 418 can be shut, while valves 419 may be opened, so that the coolant in the supply and return loops 414 and 416 may be provided by the vertical module 210. Also, if any IT cluster 110 requires enhanced cooling capacity, both valves 418 and 419 may be opened, such that cooling is provided from both the horizontal module 205 and vertical module 210. Therefore, according to this design, the single vertical module 210 can serve as backup or enhanced cooling option for any of the clusters, thereby eliminating the need for multiple backup systems.

Figure 8:
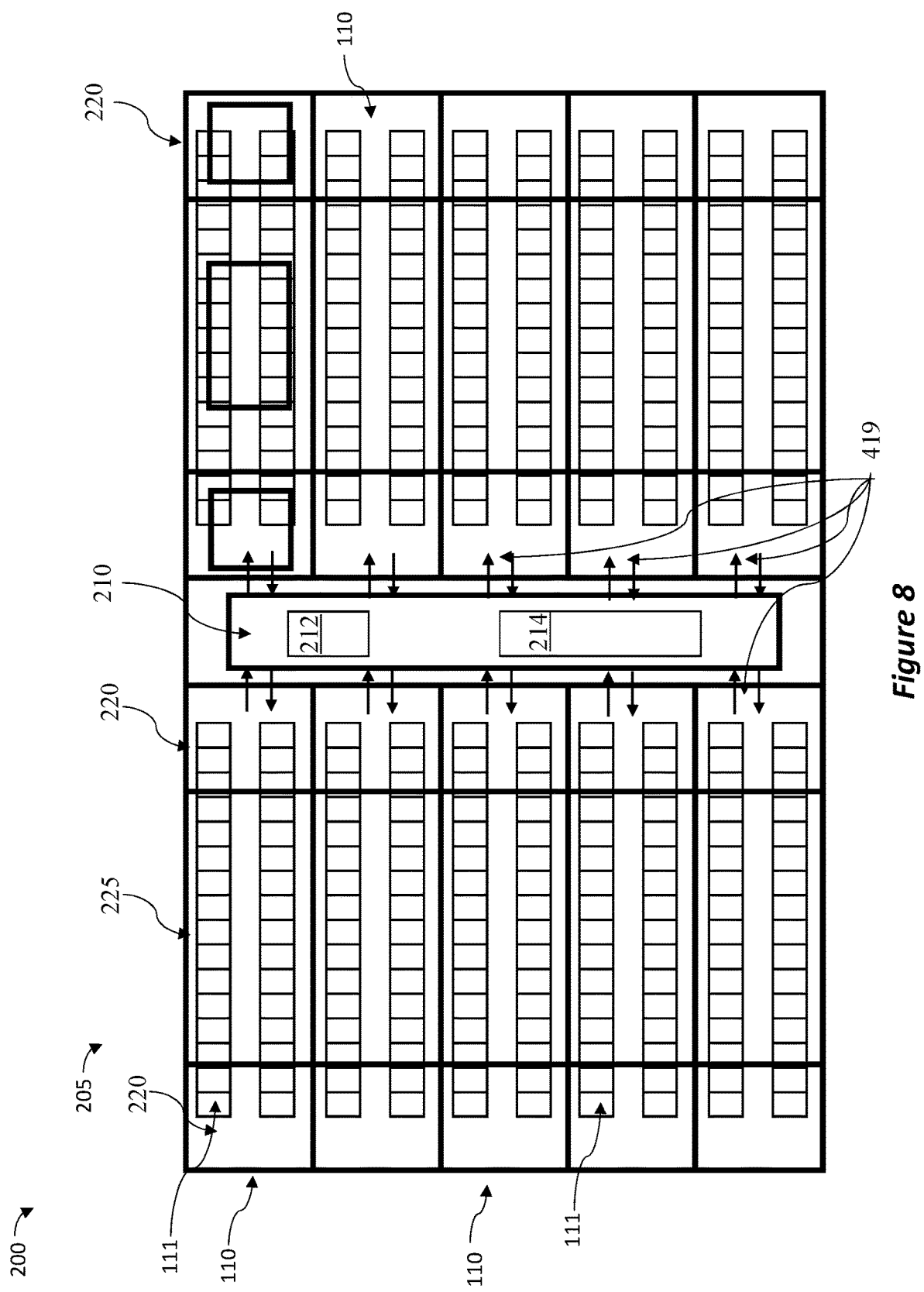
FIG. 8 is a schematic illustrating an example of the cooling system attached to two rows of IT clusters positioned back to back, according to an embodiment.

FIG. 8 illustrates another example wherein two rows of IT clusters 110 are arranged back to back, with the vertical module 210 positioned in between. In this arrangement further savings is achieved by having the vertical module serving the two rows of IT clusters 110, wherein whenever any of the racks in any of the clusters requires a backup or an enhanced supply of coolant, the valves to the supply and return loops of that particular rack are opened to receive coolant from the vertical unit 210. As indicated, in all of the disclosed embodiments the vertical unit 210 may include an independent cooling unit 214 (i.e., a heat exchanger) and a coolant unit 212, wherein the coolant unit 212 is connected to the supply and return loops of several horizontal units via multiple couplers 419. Also, in disclosed embodiments the cooling unit 214 operates to cool liquid and deliver cooled liquid to the coolant unit 212, while the coolant unit 212 operates to provide a second cooling liquid to the supply loops 414, such that the liquid delivered by the coolant unit 212 is isolated from the liquid of the cooling unit 214. In the embodiment of FIG. 8, the fluid supply and return loops (not visible) are configured for distributing cooling fluid across the entire two rows of IT clusters, and are connected to the multiple couplers 419 to selectively receive cooling liquid from the vertical unit 210. The supply loops incorporate standard connectors enabling fast and easy connection to the pipes leading to the racks. Thus, the entire cooling system can be assembled and tested at the factory and then, upon assembly on site, is simply connected to each rack and is ready for service.

Figure 9:
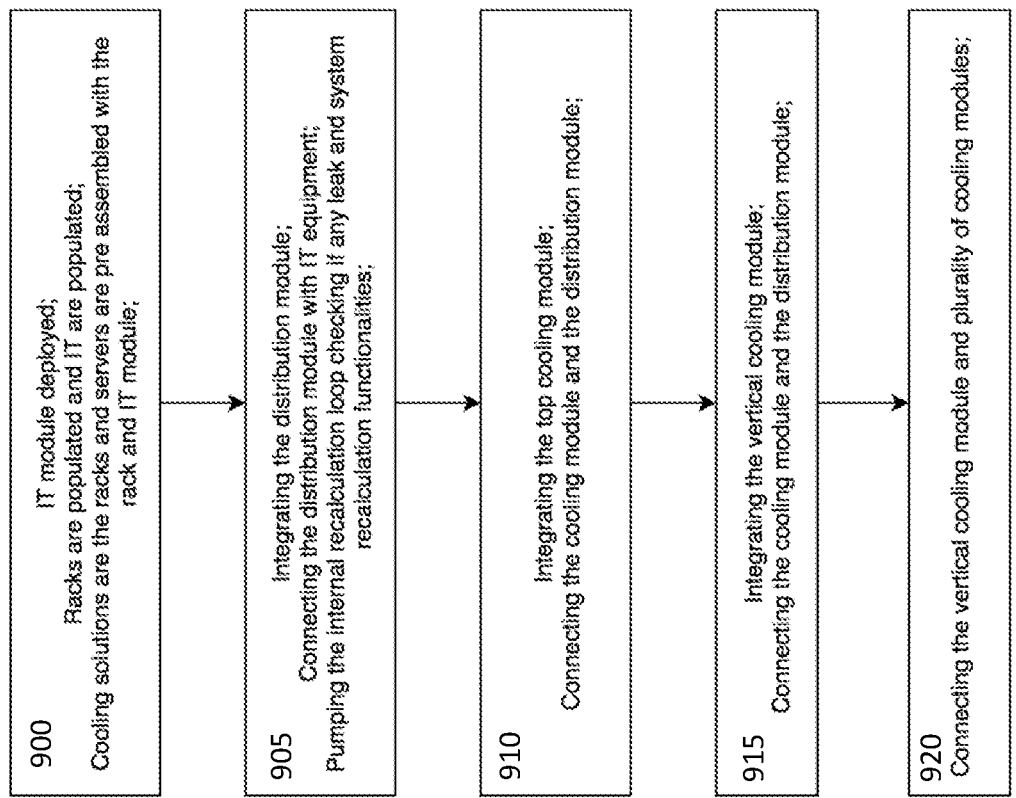
FIG. 9 is a flow chart illustrating a process according to an embodiment.

FIG. 9 is a flow chart illustrating a process for placing a cooling system into service, in a simple plug and play manner. The process is illustrated in steps, but the order provided is not mandatory and can be changed. At 900 the clusters are populated with IT equipment and the liquid cooling systems, such as processor cooling loops, etc., are assembled with the racks. At 905 the distribution module 215 is assembled over the cluster. The supply and return loops of the distribution module may be connected to the liquid cooling systems of the racks. Then liquid may be pumped and pressurized to check for any leaks. At 910 the cooling modules and coolant modules are assembled over the distribution module and the pipes from the coolant modules are connected to the loops of the distribution module. At 915 the vertical module is assembled and at 920 it is connected to the loops of the distribution modules.

Thus, disclosed embodiments provide a modular cooling system that can be easily assembled as plug and play in a data center facility. The system is two dimensional in that it includes a horizontal assembly and a vertical assembly. The horizontal assembly is the main cooling module and is dedicated to a group of server racks, while the vertical assembly is the secondary or auxiliary cooling module and can be used as a backup or to provide enhanced cooling when needed. The vertical module can be connected to several groups of server racks by connecting the coolant module of the vertical unit to several distribution modules of several horizontal units. The horizontal module incorporates a supply and return liquid loops, which provide coolant to the individual server racks from the horizontal module, from the vertical module or from both. Both the horizontal and the vertical modules incorporate a liquid to liquid heat exchanger, such that the chilled liquid delivered to the supply loop is isolated from the cold side liquid of the heat exchangers.

By the disclosed embodiments, a data center system is provided, comprising: a plurality of clusters, each cluster comprising server cooling system for cooling a plurality of server racks; a plurality of horizontal cooling assemblies, each mounted over one of the clusters and supplying cooling liquid to a respective server cooling system; and a vertical cooling assembly mounted besides the plurality of clusters and providing auxiliary cooling liquid to the server cooling system of each of the plurality of clusters.

As shown, the entire cooling system has been modularized by dividing it into multiple independent units that may be assembled together in different configurations to result in different effective cooling systems. The multiple independent units can be completely fabricated, assembled and tested in the factory, such that when the modules delivered at the site they are ready to be assembled and energized. This shortens the design and build time and drastically reduces the cost as no customization or construction work is needed. Further, if a failure occurs, the failing module may be effectively replaced without affecting the other modules.

The cooling system then is a two-dimensional liquid cooling system, and comprises: a horizontal assembly configured to be positioned over a server cluster, the horizontal assembly including at least one cooling module including a chiller, a coolant module and a distribution module; a vertical assembly configured to be positioned on a side next to the server cluster and includes a chiller; wherein the coolant module is fluidly coupled to the cooling module and to the distribution module, and receives chilled liquid from the cooling module and provides primary cooling liquid to the distribution module; wherein the distribution module is fluidly coupled to the vertical assembly and receive secondary cooling liquid from the vertical assembly; and, wherein the distribution module comprises a plurality of drop connectors connected to the server cluster and selectively provides primary cooling liquid and secondary cooling liquid to the server cluster.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

Additionally, in this disclosure the terms "first", "second", "third", "fourth", "primary", "secondary" and "auxiliary" should only be construed as used to distinguish among the different cooling liquid and not as ascribing order, priority, hierarchy or importance.

What is claimed is:

1. A two-dimensional liquid cooling system for data center, comprising:
   a horizontal assembly configured to be positioned over a server cluster, the horizontal assembly comprising:
     at least one cooling module providing a first cooling liquid;
     a coolant module; and,
     a distribution module;
   a vertical assembly configured to be positioned on a side next to the server cluster and providing a third cooling liquid;
   wherein the coolant module is fluidly coupled to the cooling module and to the distribution module, and receives the first cooling liquid from the cooling module and provides a second cooling liquid to the distribution module;

wherein the distribution module is fluidly coupled to the vertical assembly and receive the third cooling liquid from the vertical assembly; and, wherein the distribution module comprises a plurality of drop connectors connected to the server cluster and selectively provides the second cooling liquid and the third cooling liquid to the server cluster.

2. The cooling system of claim 1, wherein the coolant module comprises a heat exchanger receiving the first cooling liquid from the cooling module and providing the second cooling liquid to the distribution module.

3. The cooling system of claim 1, wherein the coolant module comprises a fluid filtration system receiving the first cooling liquid from the cooling module and providing the second cooling liquid to the distribution module.

4. The cooling system of claim 1, wherein the distribution module comprises a supply loop, a return loop and an extension module housing the plurality of drop connectors.

5. The cooling system of claim 4, wherein the extension module further comprises port holders supporting the plurality of drop connectors and a plurality of channels for dropping each of the drop connectors to a respective rack of the server cluster.

6. The cooling system of claim 5, wherein the extension module further comprises an extension heat exchanger receiving the second cooling liquid from the coolant module and supplying purified liquid to the server cluster.

7. The cooling system of claim 1, wherein the vertical assembly comprises auxiliary coolant module fluidly coupled to the distribution module.

8. The cooling system of claim 7, further comprising a first valve arrangement selectively enabling flow between the coolant module and the distribution module and a second valve arrangement selectively enabling flow between the auxiliary coolant module and the distribution module.

9. The cooling system of claim 7, wherein the auxiliary coolant module is fluidly coupled to a plurality of distribution modules.

10. A data center system, comprising:
a plurality of clusters, each cluster comprising a server cooling system for cooling a plurality of server racks;
a plurality of horizontal cooling assemblies, each mounted over one of the clusters and supplying primary cooling liquid to a respective server cooling system; and,
a vertical cooling assembly mounted besides the plurality of clusters and providing auxiliary cooling liquid to the server cooling system of each of the plurality of clusters.

11. The system of claim 10, wherein each of the horizontal cooling assemblies comprises a distribution module fluidly coupled to the vertical cooling assembly and selectively distributing the primary cooling liquid and the auxiliary cooling liquid to the respective server cooling system.

12. The system of claim 11, wherein each of the horizontal cooling assemblies comprises a cooling module and a coolant module fluidly coupled to the cooling module and the respective distribution module.

13. The system of claim 12, wherein the coolant module comprises a heat exchanger receiving first cooling liquid from the cooling module and providing the primary cooling liquid to the distribution module.

14. The system of claim 12, wherein the coolant module comprises a liquid filtration system receiving cooling liquid from the cooling module and providing the primary cooling liquid to the distribution module.

15. The system of claim 11, wherein the distribution module comprises a liquid loop layer and an extension layer, the liquid loop layer comprising a supply and return loops and the extension layer comprising a plurality of drop connectors, each coupled to one port of the server cooling system.

16. The system of claim 15, wherein the extension layer comprises port holders supporting the plurality of drop connectors, and a plurality of channels for dropping each of the drop connectors to a respective port of the server cooling system.

17. The system of claim 16, further comprising an enhanced extension layer comprising a heat exchanger and a plurality of drop connecters fluidly coupled to hot side of the heat exchanger, and wherein cold side of the heat exchanger is fluidly coupled to the liquid loop layer, forming multiple loops within the enhanced extension layer.

18. The system of claim 11, further comprising a first valve arrangement selectively enabling flow between each of the horizontal cooling assemblies and a corresponding distribution module, and a second valve arrangement selectively enabling flow between the vertical cooling assembly and the corresponding distribution module.

19. The system of claim 11, wherein the vertical cooling assembly comprises an external cooling unit and an auxiliary coolant module receiving chilled liquid from a chiller and providing the auxiliary cooling liquid to each distribution module.

20. The system of claim 10, further comprising a second set of plurality of clusters, and wherein the vertical cooling assembly is positioned between the plurality of clusters and the second set of plurality of clusters and providing the auxiliary cooling liquid to the server cooling system of each of the plurality of clusters and the second set of plurality of clusters.

* * * * *